(12) United States Patent
Katagiri

(10) Patent No.: US 10,915,120 B2
(45) Date of Patent: Feb. 9, 2021

(54) SEMICONDUCTOR DEVICE AND SEMICONDUCTOR DEVICE CONTROL METHODS

(71) Applicant: RENESAS ELECTRONICS CORPORATION, Tokyo (JP)

(72) Inventor: Daisuke Katagiri, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/547,272

(22) Filed: Aug. 21, 2019

(65) Prior Publication Data

US 2020/0097032 A1 Mar. 26, 2020

(30) Foreign Application Priority Data

Sep. 20, 2018 (JP) .................................. 2018-175998

(51) Int. Cl.
*G05F 1/46* (2006.01)
*H03K 17/042* (2006.01)
*G05F 1/567* (2006.01)

(52) U.S. Cl.
CPC .............. *G05F 1/463* (2013.01); *G05F 1/567* (2013.01); *H03K 17/04206* (2013.01)

(58) Field of Classification Search
CPC . G05F 1/46; G05F 1/463; G05F 1/567; G05F 12/00; G05F 12/02; H03K 17/042; H03K 17/04206
USPC ......................................... 363/271; 711/103
See application file for complete search history.

(56) References Cited

U.S. PATENT DOCUMENTS

| 6,217,213 | B1 * | 4/2001 | Curry ..................... G01K 1/028 |
| | | | 374/178 |
| 8,472,274 | B2 * | 6/2013 | Fai ....................... G11C 11/5642 |
| | | | 365/185.09 |
| 9,590,639 | B2 * | 3/2017 | Kawabe .................... H03L 1/00 |
| 9,594,611 | B2 * | 3/2017 | Hashimoto ............ G11C 29/52 |
| 2009/0222615 | A1 * | 9/2009 | Kurashige ............. G06F 3/0617 |
| | | | 711/103 |
| 2015/0194969 | A1 * | 7/2015 | Kawabe ................... G05F 1/463 |
| | | | 327/114 |
| 2017/0262198 | A1 * | 9/2017 | Nakata .................. G06F 1/3296 |
| 2020/0057580 | A1 * | 2/2020 | Kim ........................ G06F 3/0653 |

FOREIGN PATENT DOCUMENTS

| JP | 2009-043044 A | 2/2009 |
| JP | 2015-138916 A | 7/2015 |

* cited by examiner

*Primary Examiner* — Yemane Mehari
(74) *Attorney, Agent, or Firm* — McDermott Will & Emery LLP

(57) ABSTRACT

Methods of controlling semiconductor device and semiconductor device are provided in which a semiconductor device can define a normally operational ambient temperature at a low level. The Microcontroller includes a logical block, a temperature sensor for measuring junction temperature, a power consumption circuit for consuming predetermined power, and a Controller for controlling the consumption of power by the power consumption circuit such that the temperature measured at the temperature sensor is not less than a predetermined operational lower limit temperature of the logical block 110.

14 Claims, 12 Drawing Sheets

SEMICONDUCTOR DEVICE AND SEMICONDUCTOR DEVICE CONTROL METHODS

CROSS-REFERENCE TO RELATED APPLICATIONS

The disclosure of Japanese Patent Application No. 2018-175998 filed on Sep. 20, 2018 including the specification, drawings and abstract is incorporated herein by reference in its entirety.

BACKGROUND

The present invention relates to methods for controlling semiconductor device and semiconductor device, for example, the present invention relates to techniques for assuring semiconductor device operation.

In recent years, there has been an increasing demand for higher reliability and functional safety, particularly in the automobile industry. Therefore, in semiconductor device, an extension of the Temperature in which the semiconductor device can operate is also required.

Japanese unexamined Patent Application publication No. 2015/138916 discloses a light-emitting diode display device capable of controlling power supply to a light-emitting diode by using a linear regulator circuit including a power transistor and preventing excessive heat generation of the power transistor.

As a related technique, there is a technique described in Japanese unexamined Patent Application publication No. 2009/043044. Japanese unexamined Patent Application publication No. 2009/043044 discloses a current consumption circuit for easily suppressing a variation in a power supply voltage caused by a difference in a power consumption state caused by a circuit synchronized with a clock cycle.

SUMMARY

The technique described in Japanese unexamined Patent Application publication No. 2015/138916 prevents excessively high heating, but does not prevent excessively low junction temperature. If the junction temperature is too low due to the low ambient temperature, it may not be possible to ensure the normal operation of the logical block in the semiconductor device. Accordingly, there is a need in the art for a technique that can define a low ambient temperature at which a semiconductor device can operate normally.

Other objects and novel features will become apparent from the description of this specification and the accompanying drawings.

According to one embodiment, the semiconductor device comprises a controller for controlling the dissipation of power by the power consumption circuit such that the junction temperature measured at the temperature sensor is not less than a predetermined lower operational limit temperature of the logical block.

According to the first embodiment, the ambient temperature at which the semiconductor device can normally operate can be defined to be lower than when the technique according to the first embodiment is not used.

DETAILED DESCRIPTION

Figure 1:
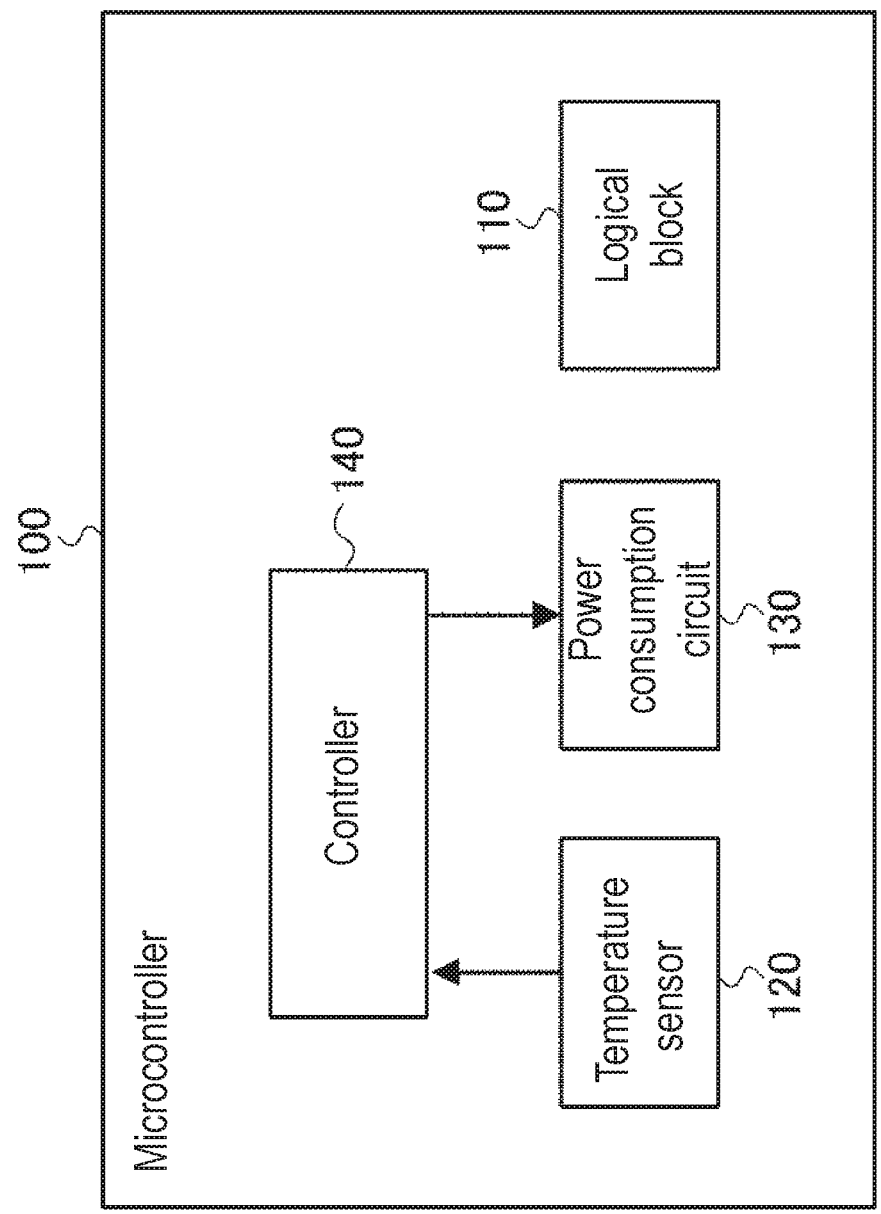
FIG. 1 is a block diagram illustrating an exemplary configuration of a Microcontroller according to a first embodiment.

For clarity of explanation, the following description and drawings are appropriately omitted and simplified. In the drawings, the same elements are denoted by the same reference numerals, and a repetitive description thereof is omitted as appropriate.

Embodiment 1

FIG. 1 is a block diagram showing an exemplary configuration of a Microcontroller 100 according to a first embodiment. In the present embodiment and the embodiments to be described later, Microcontroller is given as examples of semiconductor device, but it is needless to say that the technique according to the present disclosure may be used for a semiconductor device other than Microcontroller. As shown in FIG. 1, the Microcontroller 100 includes a logical block 110, a temperature sensor 120, a power consumption circuit 130, and a controller 140.

Here, the lower limit (hereinafter referred to as the lower limit temperature) of the temperature ranges in which the temperature sensor 120, the power consumption circuit 130, and the controller 140 can normally operate is lower than the lower limit temperature of the logical block 110. That is, when the highest value of the three lower limits temperature of the temperature sensor 120, the power consumption circuit 130, and the controller 140 is T and the lower limit temperature of the logical block 110 is $T_{1b}$, $T<T_{1b}$ is satisfied.

Generally, the Junction temperature $T_j$ of the Microcontroller 100 is equal to or larger than the ambient temperature $T_a$ of the Microcontroller. When the logical block 110 is not operating, the junction temperature $T_j$ is approximately equal to the ambient temperature $T_a$ because there is no heat generated from the logical block 110. When the logical block 110 of the Microcontroller 100 operates, the junction temperature $T_j$ becomes higher than the ambient temperature $T_a$ in response to the heat generation due to the heat generation in the logical block 110.

Therefore, when the technique of the present disclosure is not used, the lower limit of the Ambient temperature $T_a$ at which the normal operation of the Microcontroller 100 is guaranteed is $T_{1b}$. However, using the disclosed technique, the lower limit of the ambient temperature $T_a$ at which normal operation of the Microcontroller 100 is ensured may be T, which is a lower temperature.

The logical block 110 is a block of circuits for performing logical operations. For example, the logical block 110 may be a processor such as a central processing unit.

The temperature sensor 120 is a sensor for measuring the junction temperature $T_j$ of the Microcontroller 100. For example, the temperature sensor 120 is configured to include a resistor whose resistance varies depending on the temperature. As such a resistive element, for example, a bipolar transistor element or a diode element is used. The temperature sensor 120 outputs voltages depending on temperature by changing the resistance values of the resistive elements according to temperature.

The power consumption circuit 130 is a circuit that consumes predetermined power. When the power consumption is instructed by the control from the Controller 140, the power consumption circuit 130 consumes predetermined power and generates heat accordingly. More specifically, when a signal indicating power consumption is inputted from the controller 140, the power consumption circuit 130 generates heat by causing a predetermined load current to flow in the power consumption circuit 130. Specific examples of the configuration of the power consumption circuit 130 will be described referring to FIG. 2.

The Controller 140 is a circuit for controlling power dissipation by the power consumption circuit 130 so that the temperature measured by the temperature sensor 120 is not less than a predetermined lower operational limit temperature of the logical block 110. Specifically, the controller 140 acquires the junction temperature at a predetermined measuring cycle, and outputs a signal instructing the power consumption circuit 130 to consume power when the acquired junction temperature is lower than the lower limit temperature of the logical block 110. That is, when the acquired junction temperature is lower than the lower limit temperature of the logical block 110, the controller 140 turns on the power consumption circuit 130.

When the acquired Junction temperature is equal to or greater than a predetermined threshold, the controller 140 outputs a signal instructing the power consumption circuit 130 to stop consuming power. That is, the controller 140 turns off the power consumption circuit 130 when the acquired junction temperature is equal to or greater than a predetermined threshold. The controller 140 may turn on the power consumption circuit 130 when the junction temperature is equal to or greater than the lower limit temperature of the logical block 110 and less than a predetermined threshold. The predetermined threshold value may be a Temperature equal to or larger than the lower limit Temperature of the Logical block 110. Therefore, the predetermined threshold value may be the lower limit Temperature of the Logical block 110, or the predetermined threshold value may be a temperature obtained by adding margins to the lower limit temperature. The controller 140 includes a counter circuit for counting the measurement cycle, and when the counter value indicated by the counter circuit exceeds the measurement cycle, the on/off control of the power consumption circuit 130 is performed again.

When the controller 140 receives a signal instructing to terminate the temperature control using the power consumption circuit 130, the signal terminates the temperature control using the power consumption circuit 130. The signals may be outputted from, for example, the Logical block 110 which has started the operation.

Figure 2:
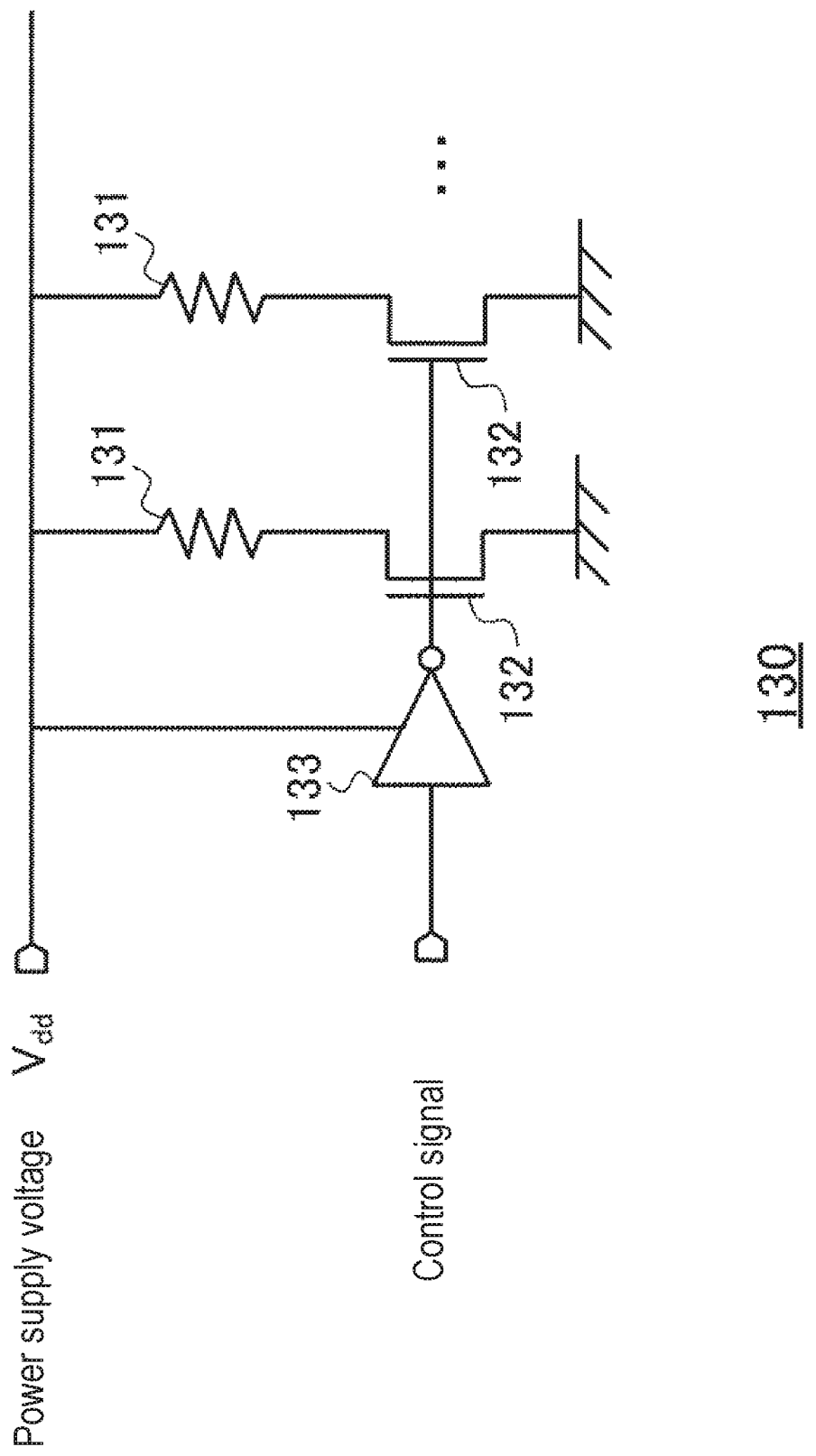
FIG. 2 is a schematic diagram illustrating an exemplary configuration of a power consumption circuit.

FIG. 2 is a circuit diagram showing an exemplary configuration of the power consumption circuit 130. As shown in FIG. 2, the power consumption circuit 130 includes a resistor 131, an n-channel MOS transistor (metal-oxide-semiconductor field-effect transistor) 132, and inverters 133.

A power supply voltage $V_{dd}$ is applied to the power consumption circuit 130, and a first state in which a current flows through the resistor 131 and a second state in which no current flows through the resistor 131 are switched in response to a control signal C from the controller 140. The control signal C corresponds to the signal for instructing the consumption of power described above. When the output from the inverter 133 is input to the gate of the n-channel MOS transistor 132 and the re-channel MOS transistor 132 is turned on, a current flows through the resistor 131 to generate heat.

The configuration shown in FIG. 2 is an exemplary configuration of the power consumption circuit 130, and the configuration of the power consumption circuit 130 is not limited to this. The power consumption circuit 130 may be a circuit that consumes power by including a heating element such as a resistor, for example.

Figure 3:
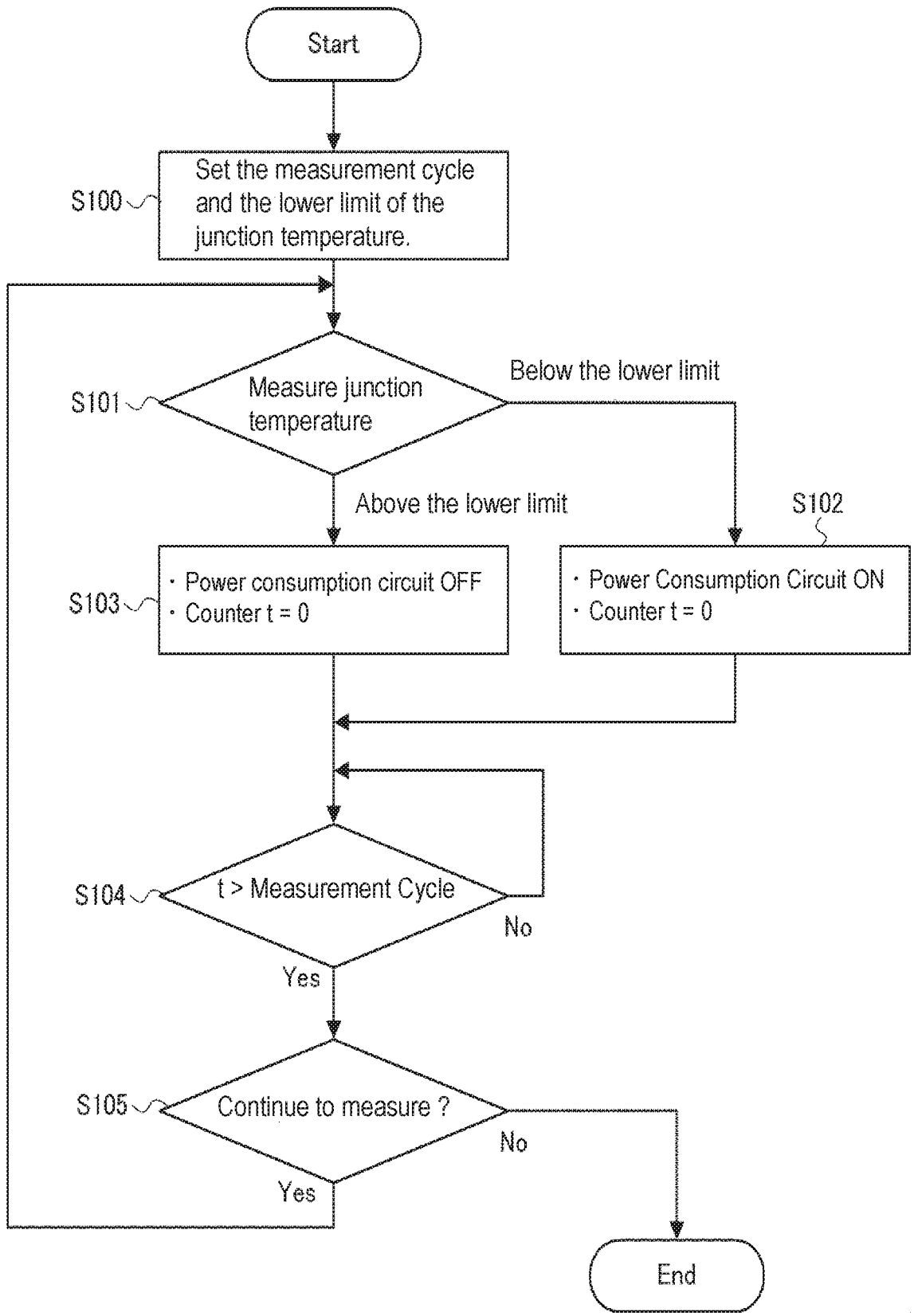
FIG. 3 is a flow chart illustrating an example of an operation relating to the control of the junction temperature in the Microcontroller according to the first embodiment.

Next, an operation related to control of junction temperature in the Microcontroller 100 will be described. FIG. 3 is a flow chart showing an exemplary operation relating to the control of the junction temperature in the Microcontroller 100. Hereinafter, the operation of the Microcontroller 100 will be described with reference to FIG. 3. The process of the temperature control shown in FIG. 3 is performed, for example, at the time of starting the Microcontroller 100, but may be performed at other predetermined timings.

In step S100, the measurement period and the lower limit of the measurement Junction temperature are set. As described above, the lower limit of the set Junction temperature is the lower limit temperature of the Logical block 110, that is, the lower limit of the temperature range in which the logical block 110 can normally operate. For example, these settings are performed by reading a predetermined measuring cycle and a predetermined lower limit temperature stored in a storage circuit such as a nonvolatile memory provided in the Microcontroller 100. The lower limit temperature is a temperature defined in advance based on semiconductor processes used for manufacturing the logical block 110, specific configurations of the logical block 110, and the like. After step S100, the process proceeds to step S101.

In step S101, the junction temperature is measured. That is, the controller 140 acquires the junction temperature of the Microcontroller 100 measured by the temperature sensor 120. Then, the controller 140 determines whether or not the acquired temperature is equal to or greater than the lower limit temperature set in the S100 of steps. If the acquired temperature is less than the lower limit temperature, the process proceeds to step S102, and if the acquired temperature is equal to or greater than the lower limit temperature, the process proceeds to step S103.

In step S102, the controller 140 turns on the power consumption circuit 130. As a result, the power consumption circuit 130 generates heat. The controller 140 resets the count t of the counter. Thereafter, the process proceeds to step S104.

In step S103, the controller 140 turns off the power consumption circuit 130. The controller 140 resets the count t of the counter. Thereafter, the process proceeds to step S104.

In step S104, the controller 140 determines whether or not the measuring cycle set in step S100 has elapsed. That is, the controller 140 determines whether or not the count value t exceeds the measuring period. When the measuring cycle has elapsed (YES in step S104), the process proceeds to step S105.

In step S105, the controller 140 determines whether a signal instructing termination of the temperature control has been received. When the signal instructing to terminate the temperature control is received, the temperature control is terminated, and when the signal instructing to terminate the temperature control is not received, the process returns to step S101.

Figure 4:
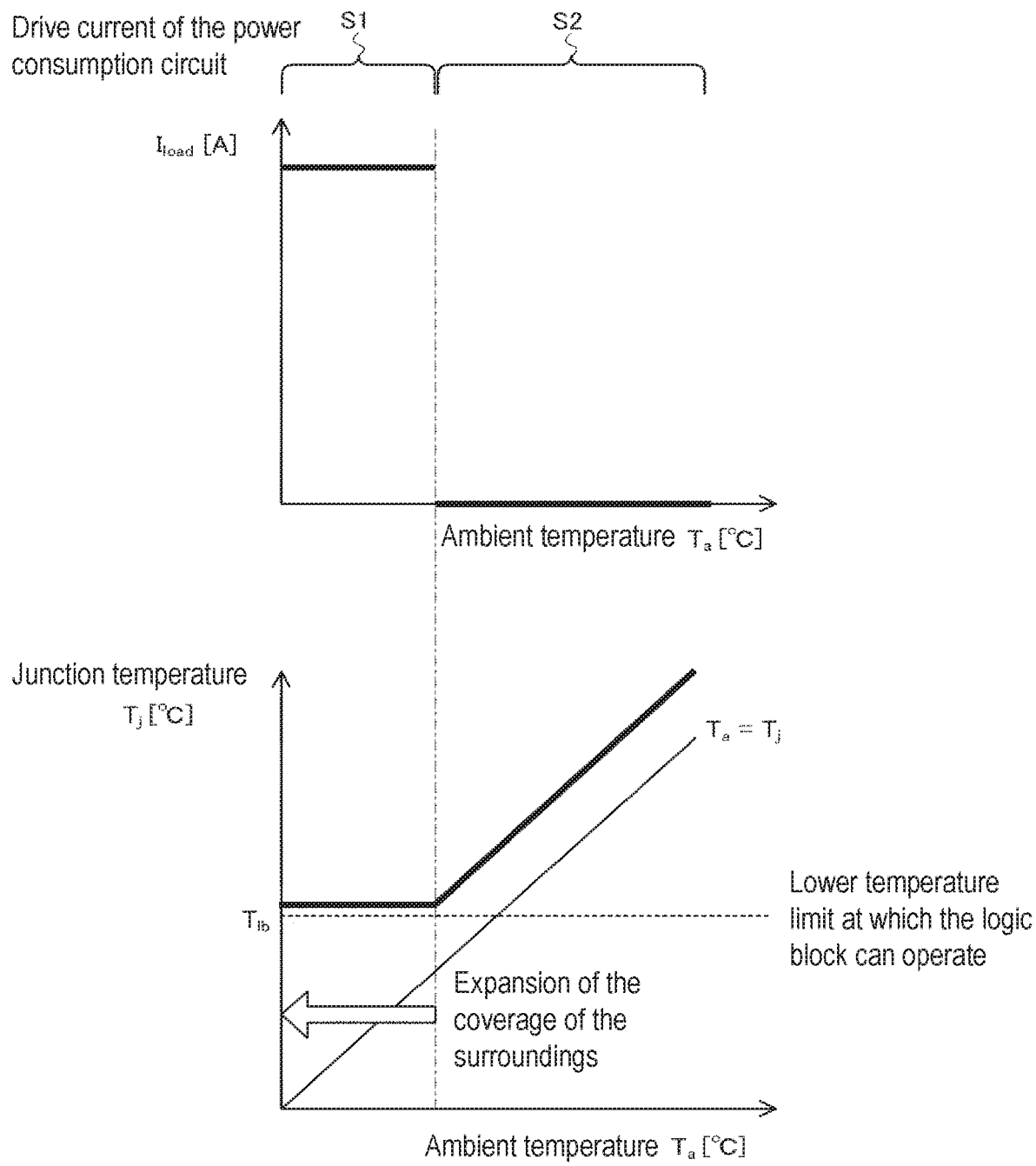
FIG. 4 is a graph showing the relation between the state of the Microcontroller and the ambient temperature according to the first embodiment.

FIG. 4 is a graphical representation of the status of the Microcontroller 100 as a function of ambient temperature. In FIG. 4, the upper graph is a graph showing the relation between the ambient temperature $T_a$ and the Driving current of the power consumption circuit 130. In FIG. 4, the graph shown in the lower part is a graph showing the relation between the ambient temperature $T_a$ and the junction temperature $T_j$.

In FIG. 4, the temperature region where the ambient temperature $T_a$ is too low, and therefore the junction temperature increase by the power consumption circuit 130 is required, is shown as the temperature region S1. On the other hand, the temperature region in which the junction temperature does not need to be increased by the power consumption circuit 130 is shown as the temperature region S2.

In the Temperature area S1, the power consumption circuit 130 is turned on, and the driving current I load flows through the power consumption circuit 130 (see the graph at the top of FIG. 4). That is, the driving current I load flows through the resistor 131. In the temperature area S1, the controller 140 controls on/off of the power consumption circuit 130 so that the junction temperature remains equal to or greater than the lower limit temperature $T_{1b}$ of the logical block 110. As a result, in the temperature area S1, the junction temperature $T_j$ is as shown in the lower graph of FIG. 4. Therefore, the coverage of the ambient temperature for the normal operation of the logical block 110 can be extended.

On the other hand, in the temperature area S2, since the ambient temperature $T_a$ is sufficiently high, the junction temperature $T_j$ becomes equal to or higher than the lower limit temperature $T_{1b}$ due to ambient temperature and temperature increase due to self-heating of the logical block 110, and thus the power consumption circuit 130 continues to be turned off.

The junction temperature $T_j$ is expressed by the following equation 1.

$$T_j = T_a + \theta_{ja} \times (I_{dd} + I_{load}) \times V_{dd} \quad \text{(Equation 1)}$$

Where $\theta_{ja}$ is the thermal resistivity of the packaging of the Microcontroller 100, $I_{dd}$ is the operation current of the Microcontroller 100, i.e., the operating current of the Logical block 110, and $V_{dd}$ is the power supply voltage of the Microcontroller 100.

The first embodiment has been described above. In the Microcontroller 100, the power consumption circuit 130 is turned on when the junction temperature is less than the operational temperature lower limit of the logical block 110, whereby the Microcontroller 100 generates heat in accordance with the consumed power and the packaged thermal resistances of the Microcontroller 100. Therefore, the junction temperature is forced to be equal to or higher than the lower limit of the temperature at which the logical block 110 can operate. As a result, the lower limit of the ambient temperature at which the operation of the Microcontroller 100 is guaranteed can be lowered as compared with when the above-described configuration is not provided. In addition, this function can reduce the difficulty of designing the Logical block 110 due to the constraint of the temperature range for operation assurance in a Microcontroller manufactured using a semiconductor process in which the logic rate (e.g., the operating frequency of the logical block 110) deteriorates at a low temperature.

Embodiment 2

Figure 5:
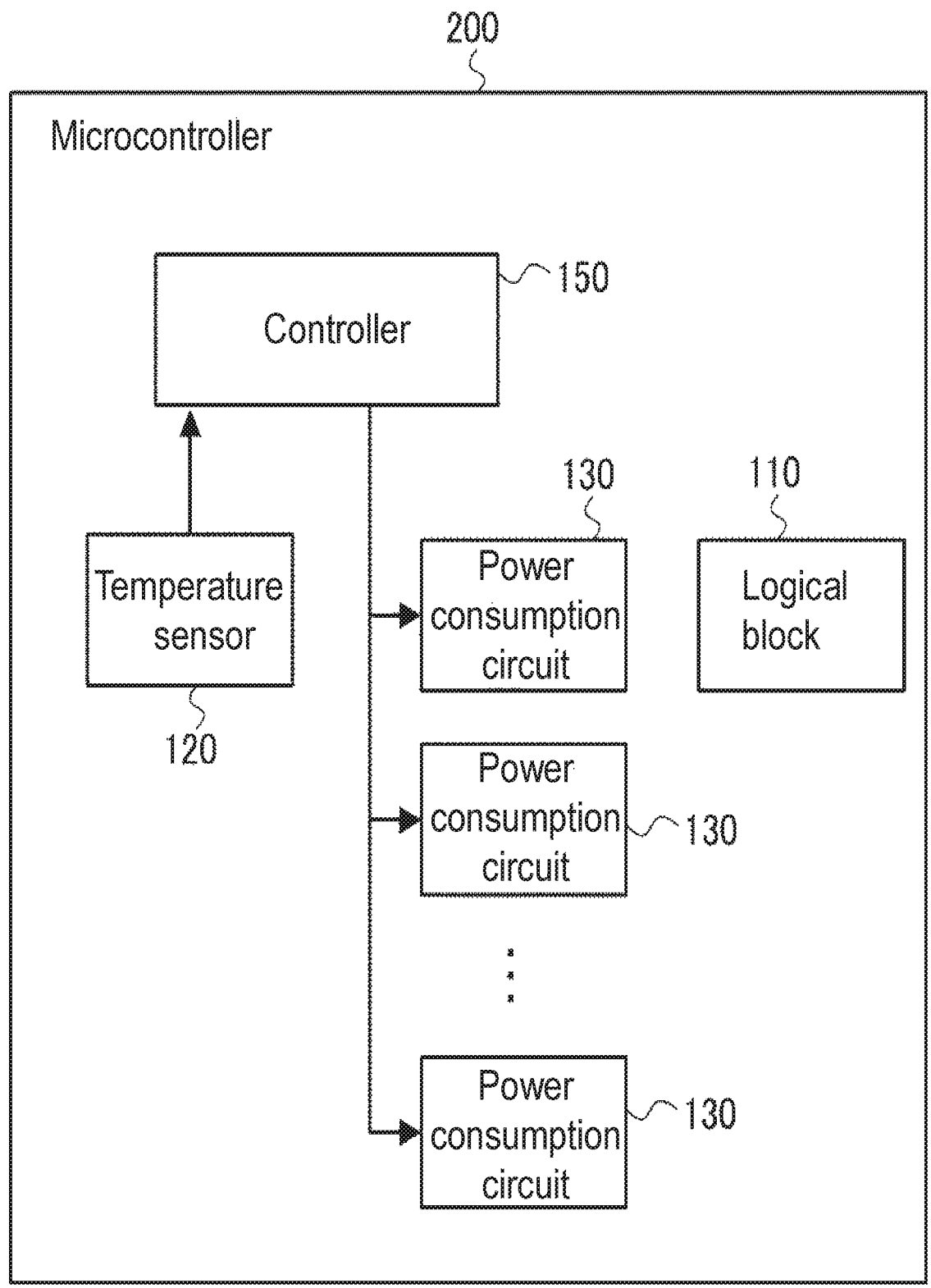
FIG. 5 is a block diagram illustrating an exemplary configuration of a Microcontroller according to the second exemplary embodiment.

Next, Embodiment 2 will be described. FIG. 5 is a block diagram showing an exemplary configuration of the Microcontroller 200 according to the second embodiment. The Microcontroller 200 is different from the Microcontroller 100 according to the first embodiment in that a plurality of power consumption circuit 130 are provided and the controller 140 is replaced with the controller 150. The controller 150 differs from the controller 140 in that it controls turning on and off of the plurality of power consumption circuit's 130. Hereinafter, the different points from Embodiment 1 will be described, and the description of the same points as Embodiment 1 will be omitted.

The controller 150 according to the present embodiment controls the power consumption circuit 130 to consume power in accordance with the difference between the temperature measured by the temperature sensor 120 and the lower limit temperature of the logical block 110. Specifically, the controller 150 turns on more power consumption circuit 130 as the present junction temperature measured by the temperature sensor 120 is lower than the lower limit temperature of the logical block 110. That is, for example, the controller 150 turns on the $N_1$ power consumption circuit 130 when the measured Junction temperature is less than the lower limit temperature and the difference between the junction temperature and the lower limit temperature of the logical block 110 is not less than $D_1$ and less than $D_2$, and turns on the $N_2$ power consumption circuit 130 when the measured junction temperature is less than the lower limit temperature and the difference between the junction temperature and the lower limit temperature of the logical block 110 is not less than $D_2$. Where $D_1 < D_2$ and $N_1 < N_2$. The Controller 150 turns off all the power consumption circuit 130 when the present junction temperature measured by the temperature sensor 120 is equal to or larger than the above-mentioned predetermined thresholds.

Figure 6:
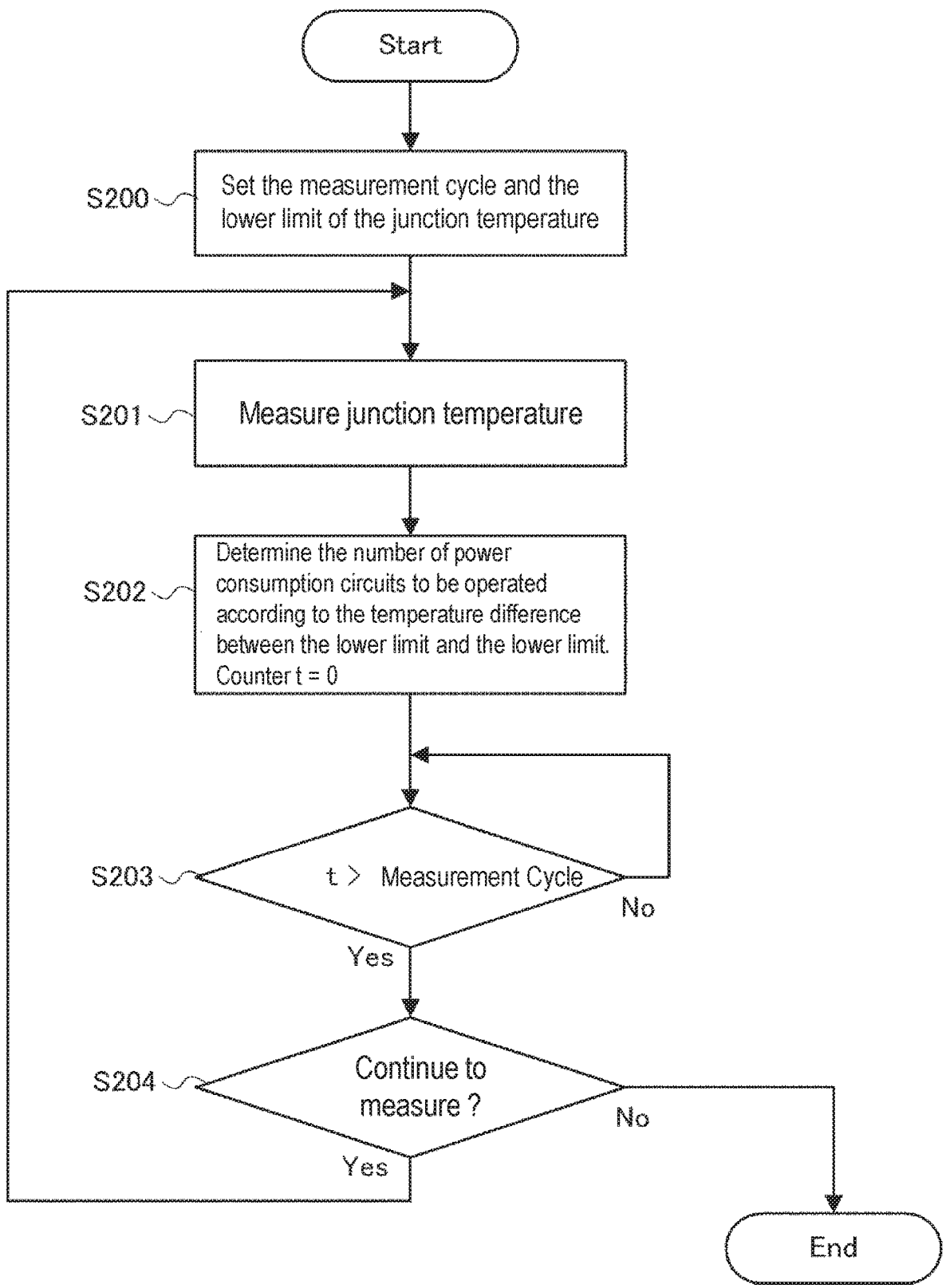
FIG. 6 is a flow chart illustrating an example of an operation relating to the control of the junction temperature in the Microcontroller according to the second embodiment.

FIG. 6 is a flow chart showing an exemplary operation related to the control of the junction temperature in the Microcontroller 200. Hereinafter, the operation of the Microcontroller 200 will be described with reference to FIG. 6. The process of the temperature control shown in FIG. 6 is performed, for example, when the Microcontroller 200 is started.

In step S200, as in step S100 of FIG. 3, the lower limits of the measuring period and junction temperature are set. After step S200, the process proceeds to step S201.

In step S201, the junction temperature is measured. That is, the controller 150 acquires the junction temperature of the Microcontroller 100 measured by the temperature sensor 120. After step S201, the process proceeds to step S202.

In step S202, the controller 150 determines the number of power consumption circuit 130 to be operated according to the temperature difference between the junction temperature obtained in step S201 and the lower limit temperature of the logical block 110. Thus, as the present junction temperature is lower than the lower limit temperature of the logical block 110, more forced heat is generated. When the present junction temperature measured by the temperature sensor 120 is equal to or larger than a predetermined threshold, the controller 150 turns off all the power consumption circuit 130. In step S202, the controller 150 resets the count t of the counter. After step S202, the process proceeds to step S203.

In step S203, similarly to step S104 in FIG. 3, the controller 150 determines whether or not the measuring cycle set in step S200 has elapsed. When the measuring cycle has elapsed (YES in step S203), the process proceeds to step S204.

In step S204, as in step S105 of FIG. 3, the controller 150 determines whether or not a signal instructing to terminate the temperature control has been received. When the signal instructing to terminate the temperature control is received, the temperature control is terminated, and when the signal instructing to terminate the temperature control is not received, the process returns to step S201.

Figure 7:
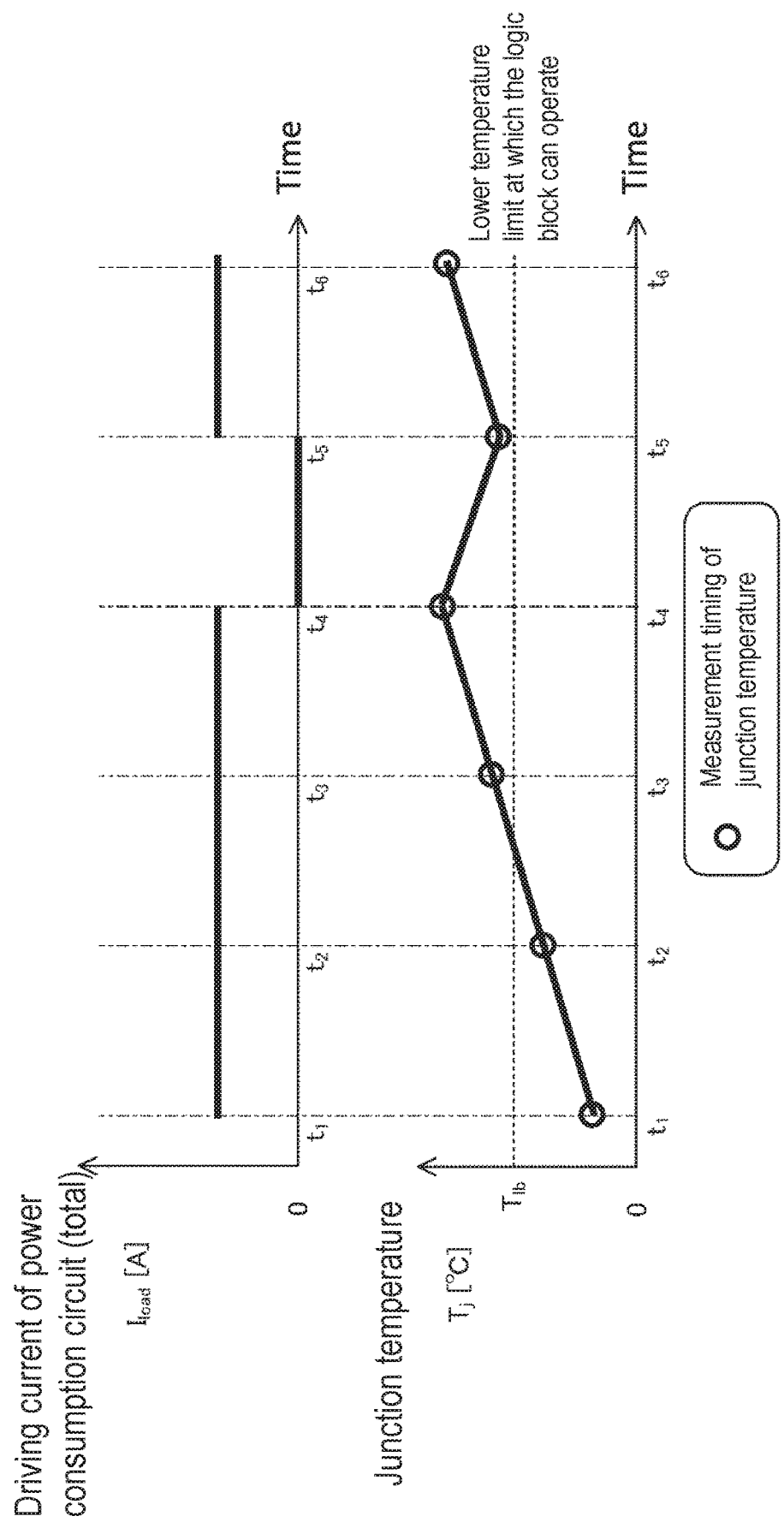
FIG. 7 is a graph illustrating the time-course transition of the state of the Microcontroller according to the first embodiment.
Figure 8:
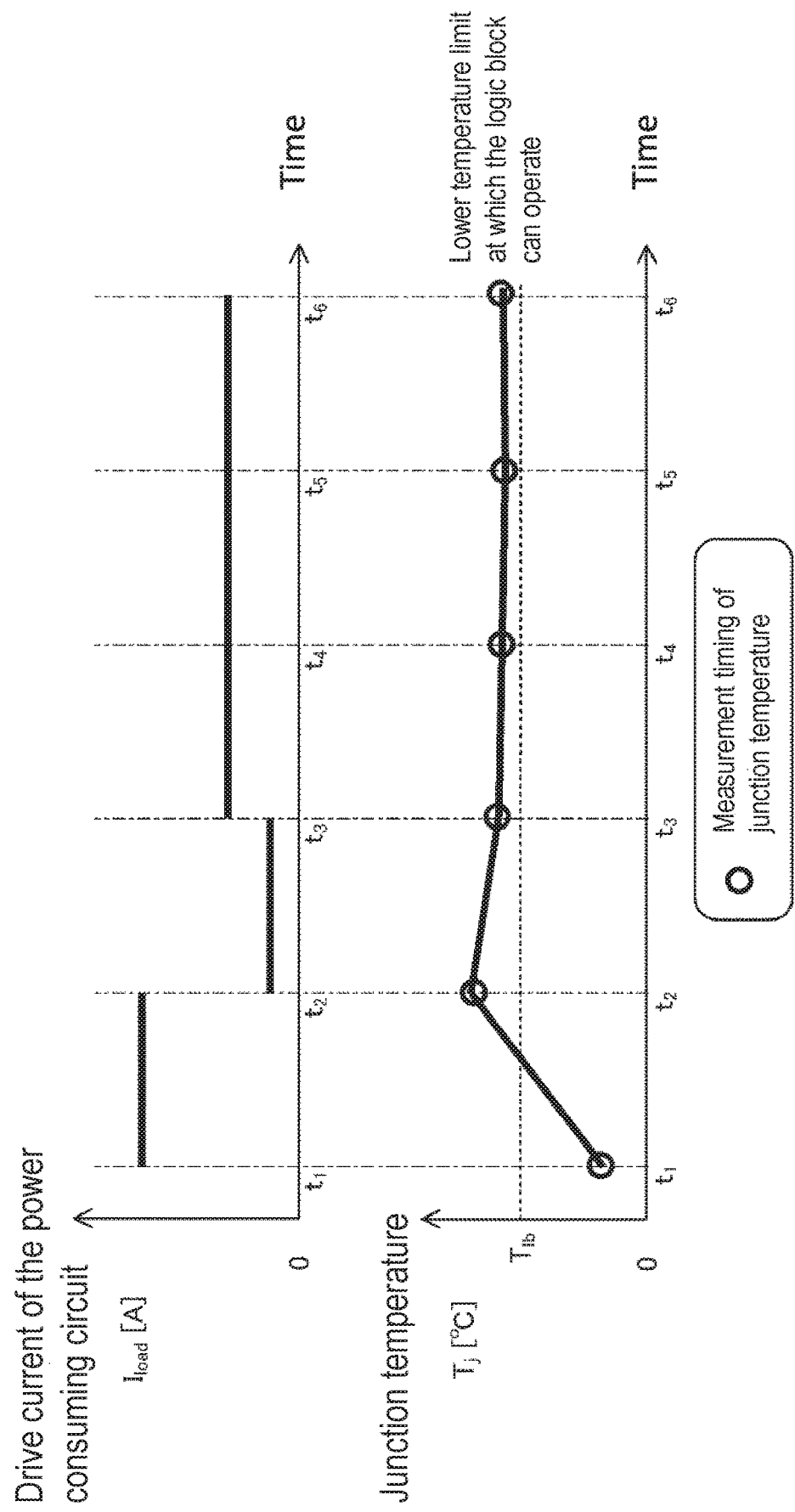
FIG. 8 is a graph illustrating the time-course transition of the state of the Microcontroller according to the second exemplary embodiment.

Next, the effect of the present embodiment will be described in comparison with Embodiment 1. FIG. 7 is a diagram showing temporal changes of states of the Microcontroller 100 according to the first embodiment. FIG. 8 is a diagram showing temporal changes of states of the Microcontroller 200 according to the second embodiment. In FIGS. 7 and 8, the graph shown in the upper part is a graph showing the transition of the sum of the driving current of the power consumption circuit 130, and the graph shown in the lower part is a graph showing the transition of the junction temperature $T_j$.

As shown in FIG. 7, in the Microcontroller 100 according to the first embodiment, only two states of Driving current exist: on and off. On the other hand, as shown in FIG. 8, in the Microcontroller 200 according to the second embodiment, the driving current can take more states. Therefore, in the Microcontroller 200 according to the second embodiment, a flexible driving current (i.e., a calorific value) according to the magnitude of the difference between the measured junction temperature and the lower limit temperature of the logical block 110 can be realized. Therefore, for example, when ambient temperature is low, by turning on many power consumption circuit 130, junction temperature can reach the lower limit temperature of the logical block 110 in few cycles. In addition, since flexible temperature control can be performed, the junction temperature can be prevented from rising excessively. Increasing the junction temperature causes an increase in leakage current, and therefore it is not preferable that the junction temperature becomes higher than required. In the present embodiment, when junction temperature is less than the lower limit temperature of the logical block 110 and the difference is small, the amount of heat generation is suppressed and the temperature is forcibly increased. Therefore, it is possible to suppress the junction temperature significantly exceeding the lower limit temperature.

Embodiment 3

Figure 9:
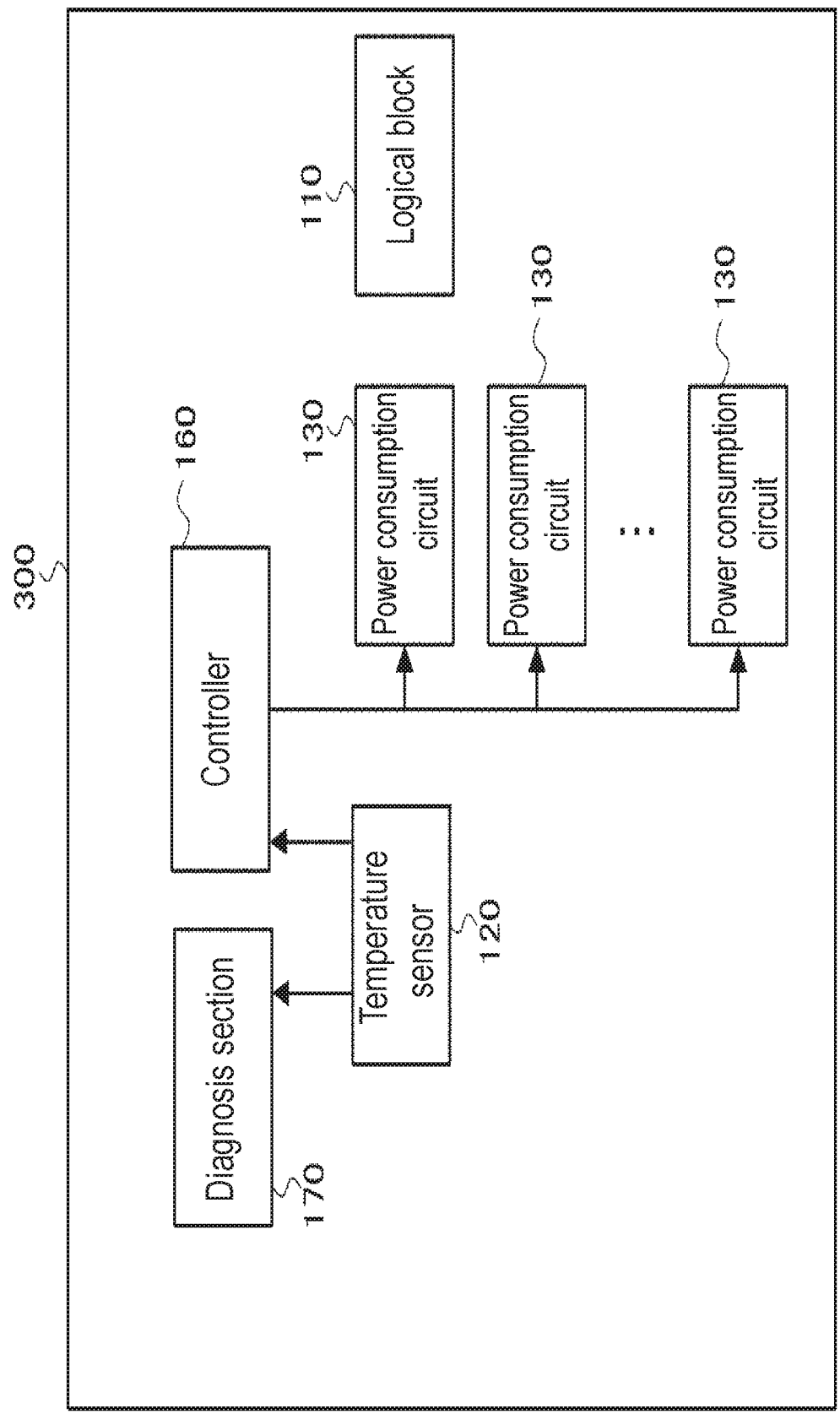
FIG. 9 is a block diagram illustrating an exemplary configuration of a Microcontroller according to the third embodiment.

Next, Embodiment 3 will be described. FIG. 9 is a block diagram showing an exemplary configuration of the Microcontroller 300 according to the third embodiment. The Microcontroller 300 differs from the Microcontroller 200 according to the second embodiment in that the controller 150 is replaced with the controller 160 and the diagnosis section 170 is added. Hereinafter, the different points from Embodiment 2 will be described, and the description of the same points as Embodiment 2 will be omitted.

The controller 160 differs from the controller 150 in that it has a control function for diagnosing the temperature sensor 120 in addition to the control function of the controller 150. Hereinafter, control functions of the controller 160 for diagnosing the temperature sensor 120 will be described.

The controller 160 controls the number of power consumption circuit that consume power (i.e., the number of power consumption circuit 130 that operate) while diagnostic operations are performed by the diagnosis section 170. In particular, the controller 160 sets the number of power consumption circuit's 130 that consume power to one or more times while the diagnostic operation is performed by the diagnosis section 170, with the number being changed. For example, the controller 160 has one power consumption circuit 130 to be operated and two power consumption circuit 130 to be operated after a predetermined waiting time has elapsed. In the present embodiment, the controller 160 changes the number to increase the number of power consumption circuit 130 to be operated while diagnosing is performed by the diagnosis section 170 at every predetermined waiting time. Specifically, while the diagnostic operation is performed by the diagnosis section 170, the controller 160 first sets the power consumption circuit 130 to be operated to 0, and then sets the power consumption circuit 130 to be operated to 1. Thereafter, in the same manner, the controller 160 increments the number of power consumption circuit 130 to be operated one by one. The number of controller 160 may be increased by n (n is an integer of 2 or more) instead of one by one.

Also, in the present embodiment, the controller 160 gradually increases the number of power consumption circuit 130 to be operated while diagnosing by the diagnosis section 170, but need not necessarily be changed so as to increase the number. For example, the controller 160 may change the number at predetermined latencies to reduce the number of power consumption circuit 130 to operate. However, it is preferable to change the number of power consumption circuit 130 to be operated to an increased number. This is because, depending on the ambient temperature, if all the power consumption circuit 130 is operated, the junction temperature may exceed the upper limit of the temperature for guaranteeing the operation of the Microcontroller 200. Therefore, as described later, as long as the junction temperature does not exceed the upper limit of the temperature range for operation guarantee, the number of the power consumption circuit 130 to be operated is changed to be increased, and when the number exceeds the upper limit, the diagnostic operation of the temperature sensor 120 can be performed within the temperature range for operation guarantee by aborting the diagnosis.

The Diagnosis section 170 diagnoses whether the temperature sensor 120 is abnormal based on the outputs of the temperature sensor 120. Thus, for example, the diagnosis section 170 may detect an anomaly in the temperature sensor 120 if no Measurement result is available from the temperature sensor 120. When the Measurement result is obtained from the temperature sensor 120, the diagnosis section 170 diagnoses the presence or absence of the abnormality of the temperature sensor 120 as follows. That is, the diagnosis section 170 diagnoses whether or not the temperature sensor 120 is abnormal by determining whether or not the temperature measured by the temperature sensor 120 varies according to the operating condition of the power consumption circuit 130. As shown in Equation 1, the junction temperature $T_j$ depends on the Driving current $I_{load}$ of the power consumption circuit 130. That is, the Junction temperature $T_j$ should vary depending on the operating condition of the power consumption circuit 130. Therefore, when the operating condition of the power consumption circuit 130 is changed, the diagnosis section 170 detects an anomaly of the temperature sensor 120 by checking whether the output result of the temperature sensor 120 after the change is changed with respect to the output result of the temperature sensor 120 before the change. That is, the diagnosis section 170 diagnoses that an error has occurred in the temperature sensor 120 when the measurement result does not change despite a change in the operating condition of the power consumption circuit 130. The diagnosis section 170 diagnoses whether the temperature sensor 120 is abnormal each time the setting of the number of power consumption circuit 130 to be operated is performed by the controller 160.

In the present embodiment, even when a variation occurs, if the variation amount is not an appropriate amount, the diagnosis section 170 diagnoses that an anomaly has occurred in the temperature sensor 120. As shown in Equation 1, the junction temperature $T_j$ varies depending on the magnitude of the driving current $I_{load}$ of the power consumption circuit 130. For this reason, it is possible to prescribe an appropriate quantity of the junction temperature that fluctuates when the number of the power consumption circuit 130 to be operated is changed. Therefore, the diagnosis section 170 determines that the temperature sensor 120 is abnormal when the deviation between the amount of variation obtained from the measurement result and the predetermined appropriate amount exceeds predetermined thresholds.

Figure 10:
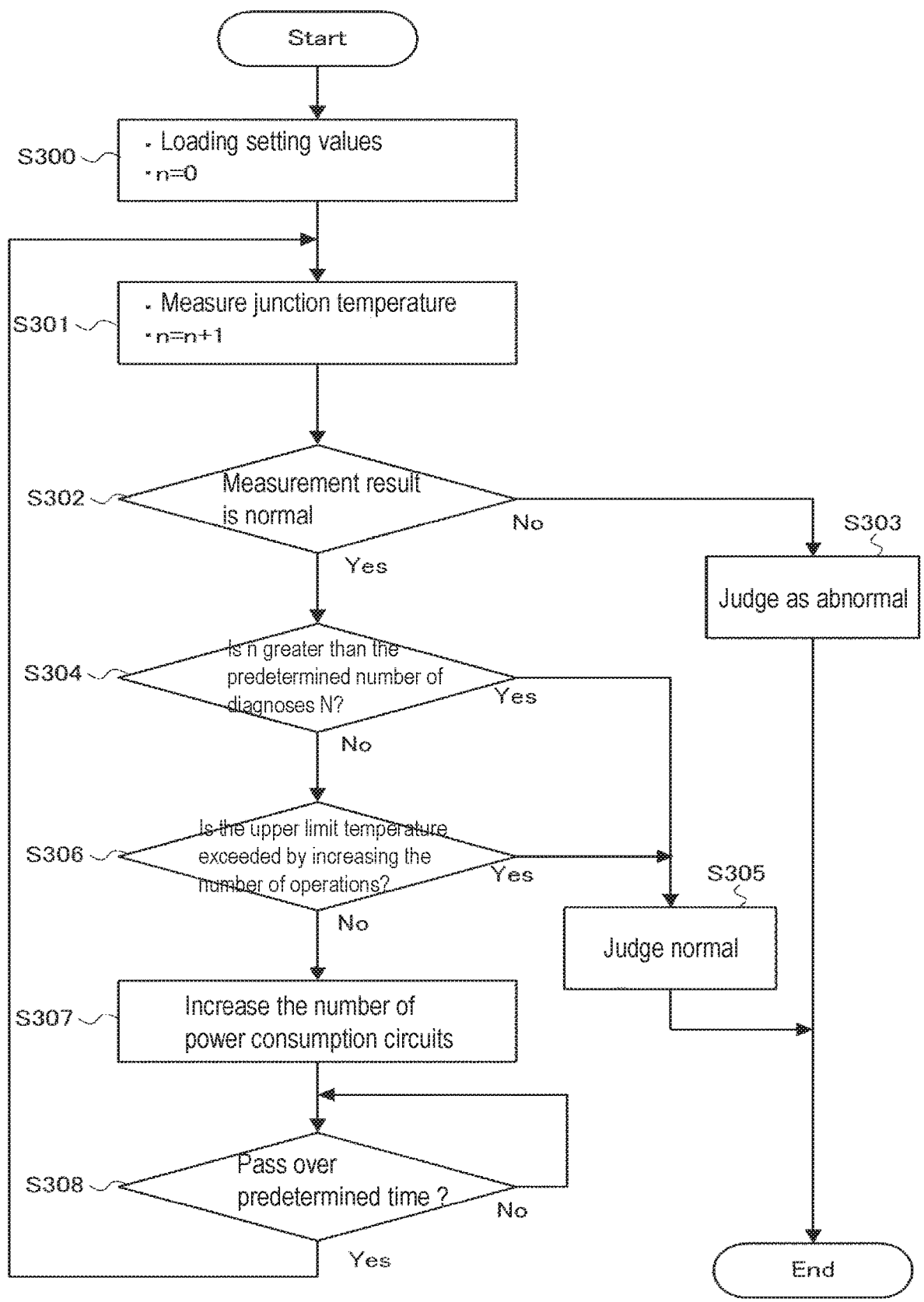
FIG. 10 is a flow chart illustrating an exemplary diagnostic operation of the Temperature sensor in the Microcontroller according to the third embodiment.

Next, the diagnostic operation of the temperature sensor 120 in the microcontroller 300 will be described. FIG. 10 is a flow chart showing an exemplary diagnostic operation of the temperature sensor 120 in the Microcontroller 300. Hereinafter, the operation of the Microcontroller 300 will be described with reference to FIG. 10.

The process of the diagnostic operation shown in FIG. 10 is performed, for example, when the Microcontroller 300 is started. Since the self-heating of the Microcontroller 300 has not started at the time of starting the Microcontroller 300, the junction temperature is lower than that at any time during the operation of the Microcontroller 300. As described above, if the junction temperature exceeds the upper limit of the temperature range for guaranteeing the operation of the Microcontroller 300, the power consumption circuit 130 to be operated for the diagnostic operation cannot be increased. The diagnosis section 170 can improve the feasibility of the diagnostic operation by performing the diagnostic at the time of starting the Microcontroller 300.

In step S300, the diagnosis section 170 reads the setting values required for diagnosis. The diagnosis section 170 reads set values stored in storage circuits such as nonvolatile memories provided in the Microcontroller 300, for example. The set values include, for example, the above-described appropriate amount, the number of diagnoses N, the waiting time $t_w$, and the number of increases I. The increment number I is a set value indicating how many times the power consumption circuit 130 to be operated is increased when the power consumption circuit 130 to be operated is changed. In step S300, the diagnosis section 170 resets the count n of the counter indicating how many times the counter has been diagnosed in the series of diagnostic operations. After step S300, the process proceeds to step S301.

In step S301, the junction temperature is measured. That is, the diagnosis section 170 acquires the junction temperature of the Microcontroller 300 measured by the temperature sensor 120. Then, the diagnosis section 170 increments the value of n by 1. After step S301, the process proceeds to step S302. In the present embodiment, when n=0, that is, when the process shifts from step S300 to step S301, the Junction temperature is measured with all the power consumption circuit 130 turned off.

In step S302, the diagnosis section 170 determines whether or not the measurement result is normal. If measurement result is abnormal, the process proceeds to step S303, and if measurement result is normal, the process proceeds to step S304. If all the power consumption circuit 130 are off, the diagnosis section 170 determines that the measurement result is abnormal if no measurement result is obtained from the temperature sensor 120, or if no measurement result indicating a predetermined temperature range (e.g., a temperature range defined as an ambient temperature of the operation assurance range) is obtained. Otherwise, the diagnosis section 170 determines that the measurement result is normal. When at least one of the plurality of power consumption circuit 130 is turned on, it is checked whether or not the difference between the junction temperature obtained this time and the junction temperature obtained last time in the step S301 (i.e., the variation $\Delta T_j$ of the junction temperature) and the deviation amount from the predetermined appropriate amount are equal to or smaller than predetermined thresholds. When the deviation exceeds the threshold, the Diagnosis section 170 determines that the measurement result is abnormal. On the other hand, when the shift amount does not exceed the threshold value, the diagnosis section 170 determines that the measurement result is normal. In step S303, the diagnosis section 170 determines that an error has occurred in the temperature sensor 120, and ends the diagnostic operation.

In step S304, the diagnosis section 170 determines whether or not the count value n is larger than the number of diagnoses N. When the count value n is larger than the number of diagnoses N, the process proceeds to step S305. In step S305, the diagnosis section 170 determines that the temperature sensor 120 is normal, and ends the diagnostic operation. If the count value n is equal to or smaller than N, the process proceeds to step S306 after step S304.

In step S306, the diagnosis section 170 determines, based on the temperature measured at the temperature sensor 120, whether junction temperature exceeds a predetermined upper limit temperature if the number of power consumption circuit 130 consuming power is increased from the present number. Specifically, the diagnosis section 170 adds the rising temperature when the power consumption circuit 130 to be turned on is increased by the predetermined increase I to the present junction temperature obtained in the step S301, and determines whether or not the addition result exceeds a predetermined upper limit Temperature (upper limit of the temperature range for guaranteeing the operation). If junction temperature exceeds the predetermined upper limit temperature if the number of power consumption circuit 130 is increased by I, then in step S305, the diagnosis section 170 determines that the temperature sensor 120 is normal and terminates the diagnostic operation. In this manner, by aborting the diagnostic operation, the diagnostic operation of the temperature sensor 120 can be performed within the Temperature range for operation assurance. If it is determined that the junction temperature does not exceed the predetermined upper limit temperature even if the number of power consumption circuit 130 is increased by I, the process proceeds to step S307.

In step S307, the controller 160 increases the number of power consumption circuit 130 consuming power, i.e., the number of power consumption circuit 130 turned on, by a predetermined increment number I. After step S307, the process proceeds to step S308. In step S308, the diagnosis section 170 checks whether or not the waiting time $t_w$ has elapsed after the power consumption circuit 130 to be turned on is increased in step S307. That is, it waits until the junction temperature is stabilized. When the waiting time $t_w$ elapses, the process returns to step S301, and it is checked whether the temperature sensor 120 normally operates in the temperature band higher than the temperature band at the previous measurement. In this manner, the diagnostic operation is repeated.

Figure 11:
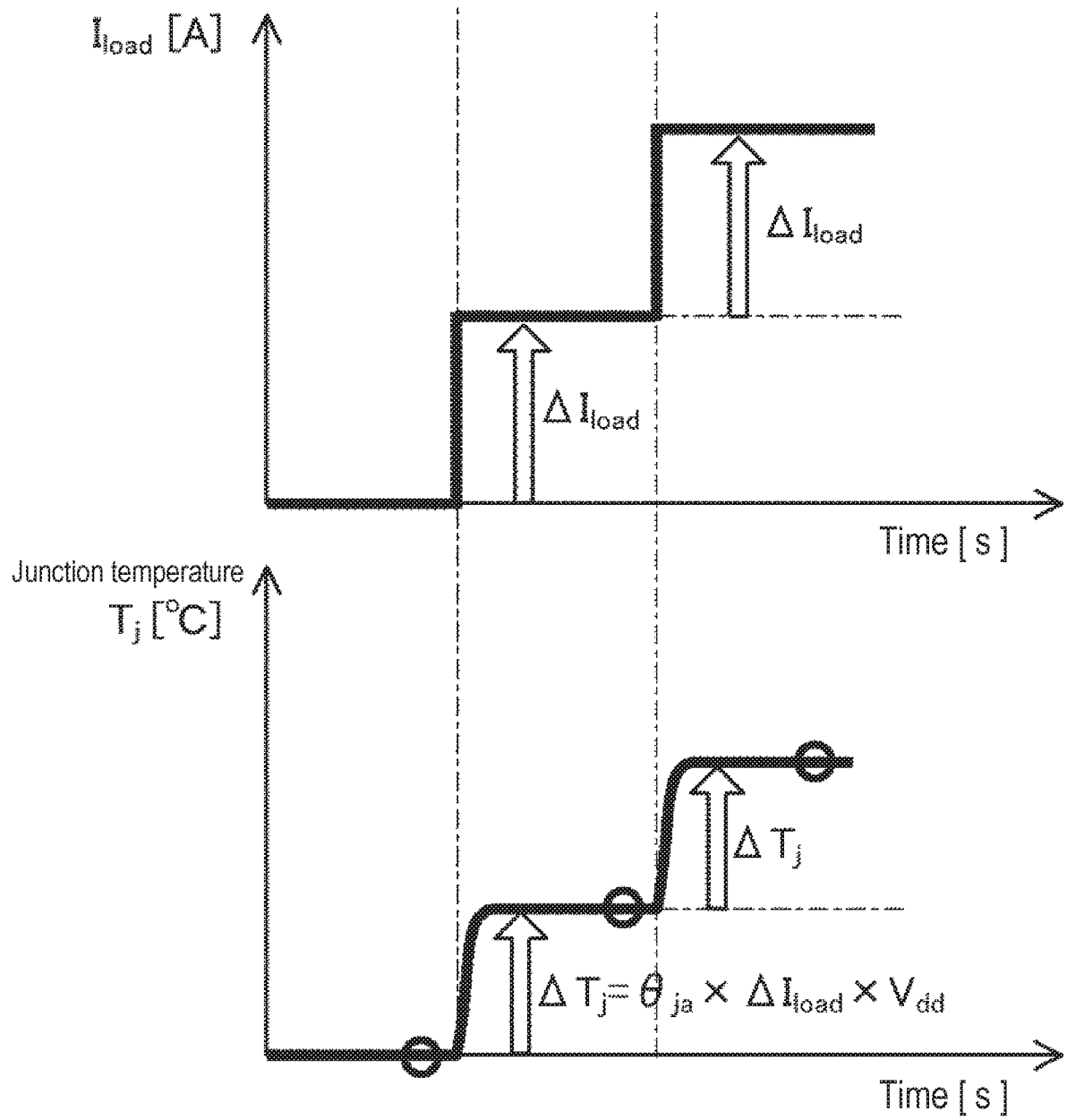
FIG. 11 is a graph illustrating the time-course transition of the state of the Microcontroller according to the third embodiment.

FIG. 11 is a graphical representation of the temporal evolution of the Microcontroller 300. The graph shown in the upper part of FIG. 11 is a graph showing the transition of the sum of the driving current of the power consumption circuit 130, and the graph shown in the lower part is a graph showing the transition of the junction temperature $T_j$. Each time the above-described step S307 is performed, the total Driving current I load increases by $\Delta I_{load}$, see the upper graph of FIG. 11. Accordingly, the junction temperature $T_j$ is expected to increase by $\Delta T_j$. In the step S302, it is confirmed that temperature rises by $\Delta T_j$. As described above, by checking the output of the temperature sensor 120 for various temperature bands, it is possible to check whether or not the output of the temperature sensor 120 is normal in various temperature bands.

The third embodiment has been described above. In the present embodiment, it is possible to confirm the outputs of the temperature sensor 120 for the respective temperature bands by forcibly varying the junction temperature. Therefore, the Microcontroller 300 can easily self-diagnosis whether or not the temperature characteristics of the temperature sensor 120 are normal. Although the present embodiment has been described as a modification of Embodiment 2, Embodiment 1 and the above-described diagnostic operation may be combined.

Embodiment 4

Next, Embodiment 4 will be described. In the embodiment described above, power consumption circuit 130 was used to force junction temperature up. The present embodiment differs from the above-described embodiment in that the power consumption circuit 130 is also used for an application other than an increase in junction temperature. Specifically, in the present embodiment, as disclosed in Japanese unexamined Patent Application publication No. 2009/043044, power consumption for suppressing fluctuation of the power supply voltage is performed. That is, in addition to the purpose of increasing the Junction temperature, the power consumption circuit 130 is used for the purpose of suppressing fluctuations in the power supply voltages.

Figure 12:
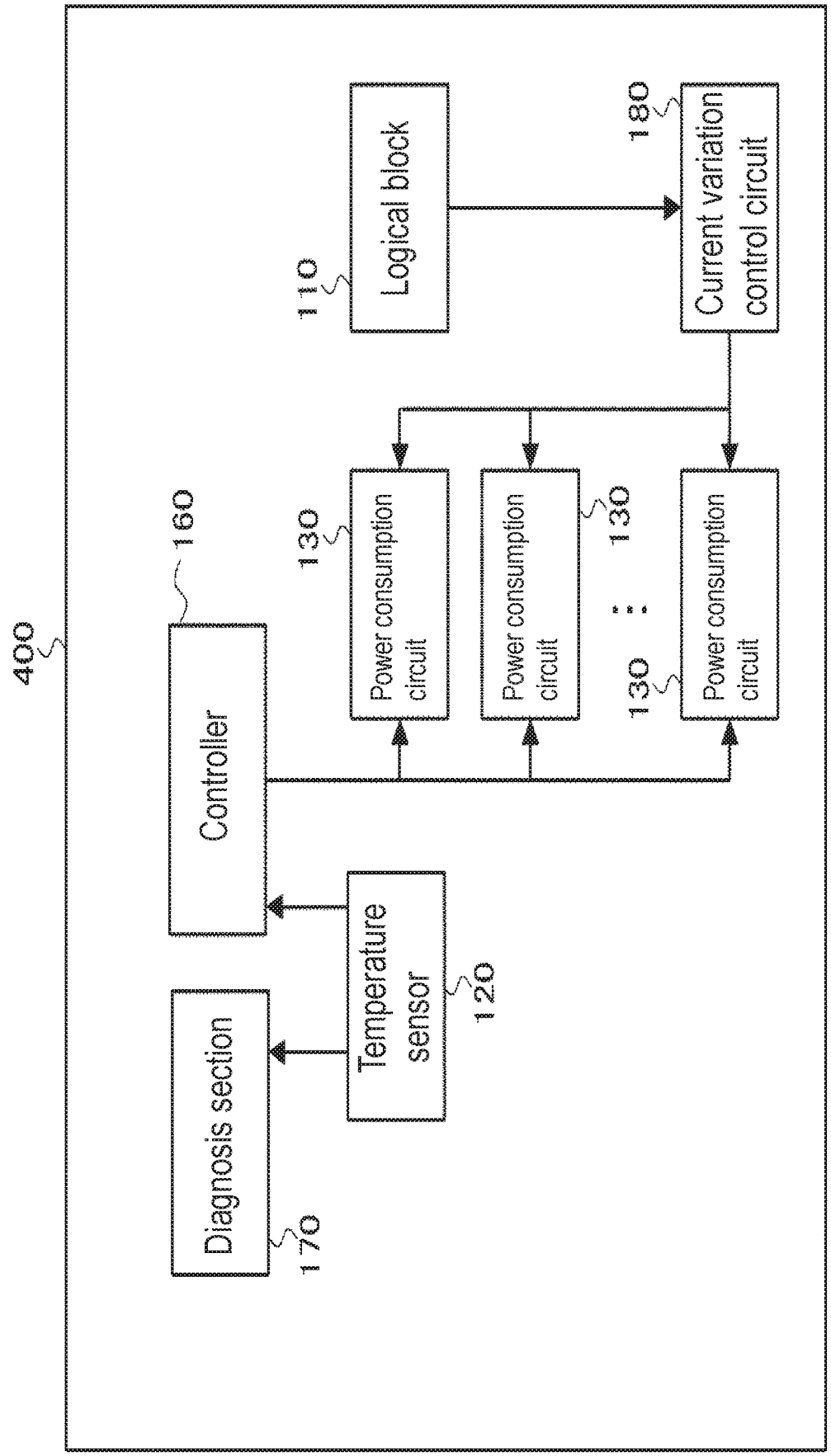
FIG. 12 is a block diagram illustrating an exemplary configuration of a Microcontroller according to the fourth embodiment.

FIG. 12 is a block diagram showing an exemplary configuration of the Microcontroller 400 according to the fourth embodiment. The Microcontroller 400 differs from the Microcontroller 300 according to the third embodiment in that a current variation control circuit 180 is added. In the following description, different points from Embodiment 3 will be described, and description of the same points as Embodiment 3 will be omitted.

The Current variation control circuit 180 controls the power consumption circuit 130 to consume predetermined power while the operation of the circuits included in the Logical block 110 is temporarily stopped. Significant reductions in current due to temporary deactivation in the logical block 110 can lead to variations in power supply voltages. For example, if the instruction executing operation of the CPUs in the logical block 110 is temporarily halted due to a pipeline stall, the amount of current is drastically reduced during that time, and as a result, the power supply voltage fluctuates. Therefore, the current variation control circuit 180 suppresses the variation of the load current in the Microcontroller 400 by causing the load current to flow through the power consumption circuit 130, for example, at the time when the operation of the logical block 110 stops. As a result, the current variation control circuit 180 suppresses variations in the power supply voltages. That is, in the present embodiment, the power consumption circuit 130 is used to forcibly raise the Junction temperature, and is used to suppress variation in the power consumed by the logical block 110.

In the present embodiment, as in the second embodiment, the controller 160 controls the power consumption circuit 130 when the Microcontroller 400 is activated. When the junction temperature reaches the lower limit temperature of the logical block 110 and the Logical block 110 starts operating, the power consumption circuit 130 is controlled to be turned on and off under the control of the current variation control circuit 180. At the time of startup, the control for diagnosing by the controller 160 and the diagnosis section 170 described in Embodiment 3 may be performed.

The fourth embodiment has been described above. In the present embodiment, the power consumption circuit 130 is used for a plurality of purposes. That is, the power consumption circuit 130 is shared to accomplish a plurality of objectives. Therefore, the chip area can be reduced as compared with the case where the power consumption circuit 130 is provided for each purpose. Since the number of circuits of the power consumption circuit 130 can be reduced as compared with the case where the power consumption circuit 130 is provided for each purpose, the total amount of leakage current can also be suppressed. In the present embodiment, the power consumption circuit 130 is used to suppress fluctuations in power supply voltages, but it is needless to say that the power consumption circuit 130 may be used in common for other purposes. In addition, although this embodiment mode has been described as a mode in which Embodiment mode 3 is changed, the power consumption circuit 130 may be used for other purposes in the configuration described in Embodiment mode 1 or Embodiment mode 2.

Although the invention made by the inventor has been specifically described based on the embodiment, the present invention is not limited to the embodiment already described, and it is needless to say that various modifications can be made without departing from the gist thereof.

For example, the controller 140, 150, 160 and the diagnosis section 170 may be software instead of hardware circuits. That is, for example, the processes of the controller 140, 150, 160, and the Diagnosis section 170 may be executed by a processor provided in the Microcontroller separately from the logical block 110 executing a program (more specifically, a program including one or more instructions) stored in a memory provided in the Microcontroller. Preferably, the processors and memories are guaranteed to operate at a temperature lower than the lower temperature of the Logical block 110.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

What is claimed is:

1. A semiconductor device comprising:
   a logical block that has a lower limit temperature, the lower limit temperature being a lower limit of a temperature range in which the logical block can operate;
   a temperature sensor that measures a junction temperature of the semiconductor device; and
   a power consumption circuit that consumes a certain amount of power when the power consumption circuit is turned ON;
   a controller that:
      receives the measured junction temperature from the temperature sensor;
      when the measured junction temperature is lower than the lower limit temperature of the logical block, turns ON the power consumption circuit; and
      when the measured junction temperature is equal to or greater than the lower limit temperature of the logical block, turns OFF the power consumption circuit.

2. The semiconductor device according to claim 1, wherein the semiconductor device comprises a plurality of the power consumption circuits, and
   wherein the controller controls the power consumption by using some of the plurality of the power consumption circuits corresponding to a difference between the temperature measured by the temperature sensor and the lower limit temperature.

3. The semiconductor device according to claim 1, further comprising:
   a diagnosis section diagnoses whether the temperature sensor is abnormal based on the outputs of the temperature sensor.

4. The semiconductor device according to claim 3, wherein the diagnosis section diagnoses whether the temperature sensor is abnormal by determining whether the temperature measured at the temperature sensor varies depending on the operating conditions of the power consumption circuit.

5. The semiconductor device according to claim 4, wherein the semiconductor device comprises a plurality of the power consumption circuits,
   wherein the controller sets a number of the power consumption circuits to consume power to one or more times while a diagnostic operation is performed by the diagnosis section with a change in the number, and
   wherein the diagnosis section diagnoses whether the temperature sensor is abnormal each time a setting of numbers by the controller is performed.

6. The semiconductor device according to claim 5, wherein the controller performs a number change to increase the number of the power consumption circuits that consume power while diagnostics are performed by the diagnosis section.

7. The semiconductor device according to claim 6, wherein the diagnosis section determines, based on the temperature measured at the temperature sensor, whether the junction temperature exceeds a predetermined upper limit temperature if the number of the power consumption circuits that consume power is increased from a present number of power consumption circuits consuming power, and terminates the diagnostic operation if the junction temperature exceeds the predetermined upper limit temperature.

8. The semiconductor device according to claim 3, wherein the diagnosis section performs diagnostics upon activation of said semiconductor device.

9. The semiconductor device according to claim 1, wherein the power consumption circuit is also used for other applications than said junction temperature measurement.

10. The semiconductor device according to claim 9, further comprising:
    a varying controller controls the power consumption circuit to consume predetermined power while the operation of the circuits included in the logical block is temporarily stopped.

11. A method for control of a semiconductor device, the method comprising:
    measuring a junction temperature of the semiconductor device;
    when the measured junction temperature is lower than a lower limit temperature of a logical block of the semiconductor, turning ON a power consumption circuit to consume predetermined power, wherein the lower limit temperature being a lower limit of a temperature range in which the logical block can operate; and
    when the measured junction temperature is equal to or greater than the lower limit temperature of the logical block, turning OFF the power consumption circuit.

12. A semiconductor device comprising:
    a logical block that has a lower limit temperature, the lower limit temperature being a lower limit of a temperature range in which the logical block can operate;
    a power consumption circuit that consumes a certain amount of power when the power consumption circuit is turned ON; and
    a controller that 1) turns ON the power consumption circuit when a junction temperature of the semiconductor device is lower than a lower limit temperature of a logical block of the semiconductor, turns ON, wherein the lower limit temperature being a lower limit of a temperature range in which the logical block can operate the power consumption circuit.

13. The semiconductor device according to claim 12, further comprising:
    a temperature sensor measures the junction temperature.

14. The semiconductor device according to claim 12, wherein the controller turns OFF the power consumption circuit when the junction temperature is equal to or greater than the lower limit temperature of the logical block.

* * * * *